(12) United States Patent
Jung et al.

(10) Patent No.: US 9,177,904 B2
(45) Date of Patent: Nov. 3, 2015

(54) CHIP-ON-FILM PACKAGE AND DEVICE ASSEMBLY INCLUDING THE SAME

(71) Applicant: Samsung Electronics Co., Ltd., Suwon-Si, Gyeonggi-Do (KR)

(72) Inventors: Jae-Min Jung, Seoul (KR); Sang-Uk Han, Hwaseong-si (KR); KwanJai Lee, Yongin-si (KR); KyongSoon Cho, Goyang-si (KR); Jeong-Kyu Ha, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 222 days.

(21) Appl. No.: 13/769,520

(22) Filed: Feb. 18, 2013

(65) Prior Publication Data

US 2013/0293816 A1 Nov. 7, 2013

(30) Foreign Application Priority Data

May 3, 2012 (KR) .................. 10-2012-0047000

(51) Int. Cl.
*G02F 1/1343* (2006.01)
*H01L 23/498* (2006.01)
*H01L 51/52* (2006.01)

(52) U.S. Cl.
CPC ...... *H01L 23/49827* (2013.01); *H01L 23/4985* (2013.01); *H01L 51/52* (2013.01); *H01L 51/524* (2013.01); *H01L 2924/0002* (2013.01)

(58) Field of Classification Search
CPC .................. H01L 23/49827; H01L 23/498
USPC .................. 349/139; 257/88, 40, 774; 438/28
See application file for complete search history.

(56) References Cited

U.S. PATENT DOCUMENTS

| 5,736,780 | A * | 4/1998 | Murayama ............... 257/673 |
| 6,433,414 | B2 * | 8/2002 | Saito ..................... 257/684 |
| 6,534,722 | B2 | 3/2003 | Takaoka |
| 6,657,606 | B2 | 12/2003 | Kang et al. |
| 6,677,664 | B2 | 1/2004 | Inoue et al. |
| 7,271,860 | B2 | 9/2007 | Fukuta et al. |
| 8,319,109 | B2 * | 11/2012 | Ishii ..................... 174/254 |
| 8,564,970 | B2 * | 10/2013 | Chen et al. ............. 361/792 |
| 8,704,762 | B2 * | 4/2014 | Anno et al. ............. 345/156 |
| 2001/0033009 | A1 * | 10/2001 | Inoue et al. ............. 257/668 |
| 2002/0027634 | A1 | 3/2002 | Kang et al. |
| 2002/0174998 | A1 | 11/2002 | Takaoka |
| 2003/0067064 | A1 * | 4/2003 | Kim ..................... 257/686 |
| 2005/0024553 | A1 | 2/2005 | Fukuta et al. |
| 2007/0034402 | A1 | 2/2007 | Cheng |

(Continued)

FOREIGN PATENT DOCUMENTS

| JP | 07-270814 A | 10/1995 |
| JP | 2001-133756 A | 5/2001 |
| JP | 2001-148547 A | 5/2001 |
| JP | 2007-079133 A | 3/2007 |

(Continued)

*Primary Examiner* — Sang V Nguyen
(74) *Attorney, Agent, or Firm* — Harness, Dickey & Pierce, P.L.C.

(57) ABSTRACT

Chip-on-film packages and device assemblies including the same may be provided. The device assembly includes a film package including a semiconductor chip, a panel substrate connected to one end of the film package, a display panel disposed on the panel substrate, and a controlling part connected to another end of the film package. The film package includes a film substrate, a first wire disposed on a top surface of the film substrate, and a second wire disposed on a bottom surface of the film substrate.

12 Claims, 8 Drawing Sheets

(56) References Cited

U.S. PATENT DOCUMENTS

| | | | |
|---|---|---|---|
| 2009/0166065 A1* | 7/2009 | Clayton et al. | 174/254 |
| 2009/0303426 A1* | 12/2009 | Kim | 349/150 |
| 2010/0033009 A1* | 2/2010 | Knechtges | 303/191 |
| 2010/0060601 A1* | 3/2010 | Oohira | 345/173 |
| 2012/0050190 A1* | 3/2012 | Lai et al. | 345/173 |

FOREIGN PATENT DOCUMENTS

| | | |
|---|---|---|
| JP | 2008-256772 A | 10/2008 |
| KR | 10-0649214 B1 | 11/2006 |
| KR | 10-0686585 B1 | 2/2007 |
| KR | 10-0765478 B1 | 10/2007 |
| KR | 10-2008-0002007 A | 1/2008 |

* cited by examiner

CHIP-ON-FILM PACKAGE AND DEVICE ASSEMBLY INCLUDING THE SAME

CROSS-REFERENCE TO RELATED APPLICATIONS

This U.S. non-provisional patent application claims priority under 35 U.S.C. §119 to Korean Patent Application No. 10-2012-0047000, filed on May 3, 2012, the entirety of which is incorporated by reference herein.

BACKGROUND

The inventive concepts relate to a semiconductor package technique and, more particularly, to chip-on-film packages and/or device assemblies including the same.

Recently, a chip-on-film (COF) package technique using a flexible film substrate has been developed as a high density semiconductor chip mounting technique enabling smaller, thinner, and lighter electronic products. According to the COF package technique, a semiconductor die is directly bonded to a substrate by a flip chip bonding method and is connected to an external circuit by a short lead, and thus dense wire patterns can be formed. Therefore, the COF packaging is a remarkable technique to achieve higher integration packages. A chip-on-film package may be applied to portable devices such as a cellular phone and a personal digital assistant (PDA), a laptop computer, a display device, etc.

SUMMARY

Example Embodiments are related to chip-on-film packages having higher reliability and/or device assemblies including the same.

According to an example embodiment, a chip-on-film package includes a film substrate including a first surface and a second surface opposite to each other, a first wire disposed on the first surface, a second wire disposed on the second surface, and a semiconductor chip is disposed on one of the first and second surfaces.

The chip-on-film package may further include at least one through-wire penetrating the film substrate and electrically connecting the first wire to the second wire.

The first wire or the second wire may be locally disposed on the film substrate.

According to an example embodiment, a device assembly includes a film package, a panel substrate connected to one end of the film package, and a display panel disposed on the panel substrate. The film package may include a semiconductor chip, a film substrate, a first wire disposed on a top surface of the film substrate, and a second wire disposed on a bottom surface of the film substrate.

The panel substrate may be electrically connected to the first wire.

The film package may include at least one through-wire electrically connecting the first wire to the second wire.

The controlling part may include a circuit substrate and/or an electric component connected to the circuit substrate. The circuit substrate may be a printed circuit board (PCB) or a flexible printed circuit board (FPCB).

The semiconductor chip and the controlling part may be disposed on the first wire and are electrically connected to each other through the first wire.

The semiconductor chip and the controlling part may be disposed on the second wire and are electrically connected to each other through the second wire.

The semiconductor chip may be disposed on the first wire and may be electrically connected to the first wire, and the controlling part may be disposed on the second wire and may be electrically connected to the second wire.

The circuit substrate may be disposed one of the first and second wires and the electric component may be disposed on the other one of the first and second wires.

At least one of the panel substrate and the film substrate may have flexibility.

The display panel may include an organic light emitting device or a liquid crystal panel.

The device assembly may further include a touch panel disposed on the display panel, and a touch panel driver connected to one end of the touch panel.

According to an example embodiment, a device assembly includes a flexible film substrate having a U shape at least one end thereof and having a first surface and a second surface being opposite to each other, a first wire on the first surface, and a second wire on the second surface. The first wire may include a first metal material, and the second wire may include a second metal material.

A device assembly herein may further include a through-wire penetrating the flexible film substrate. The through-wire may be in contact with the first and second wires.

A devise assembly may further include a semiconductor chip on the first wire, a circuit substrate on the first wire, an electric component in the circuit substrate, and a display panel on the first surface of the flexible film substrate. The semiconductor chip, the electric component, and the display panel may be electrically connected to each other by the first wire.

A devise assembly may further include a display panel on the first surface of the flexible film substrate, a semiconductor chip on the second wire, a circuit substrate on the second wire, an electric component. The display panel may be electrically connected to the first wire, the semiconductor chip and the electric component may be electrically connected to each other by the second wire, and the first and second wires may be electrically connected to each other by a through-wire penetrating the flexible film substrate.

A devise assembly may further include a display panel on the first surface of the flexible film substrate, a semiconductor chip on the first wire, a circuit substrate on the second wire, and an electric component on the circuit substrate. The display panel and the semiconductor chip may be electrically connected to each other by the first wire, and the electric component may be electrically connected to the semiconductor chip and the display panel by a through-wire penetrating the flexible film substrate.

A devise assembly may further include a semiconductor chip on the first wire, an electric component, and a display panel on the first surface of the flexible film substrate. The electric component is a printed circuit formed of the first wire. The semiconductor chip, the electric component, and the display panel may be electrically connected to each other by the first wire.

A devise assembly may further include a display panel on the first surface of the flexible film substrate, a semiconductor chip on the second wire, and an electric component. The electric component is a printed circuit formed of the second wire. The display panel may be electrically connected to the first wire, the semiconductor chip and the electric component may be electrically connected to each other by the second wire, and the first and second wires may be electrically connected to each other by a through-wire penetrating the flexible film substrate.

A devise assembly may further include a display panel on the first surface of the flexible film substrate, a semiconductor chip on the first wire, and an electric component. The electric component is a printed circuit formed of the second wire. The display panel and the semiconductor chip may be electrically connected to each other by the first wire, and the electric component may be electrically connected to the semiconductor chip and the display panel by a through-wire penetrating the flexible film substrate.

BRIEF DESCRIPTION OF THE DRAWINGS

The inventive concepts will become more apparent and more readily appreciated in view of the following drawings and accompanying detailed description of the example embodiments.

DETAILED DESCRIPTION OF THE EMBODIMENTS

Figure 1:
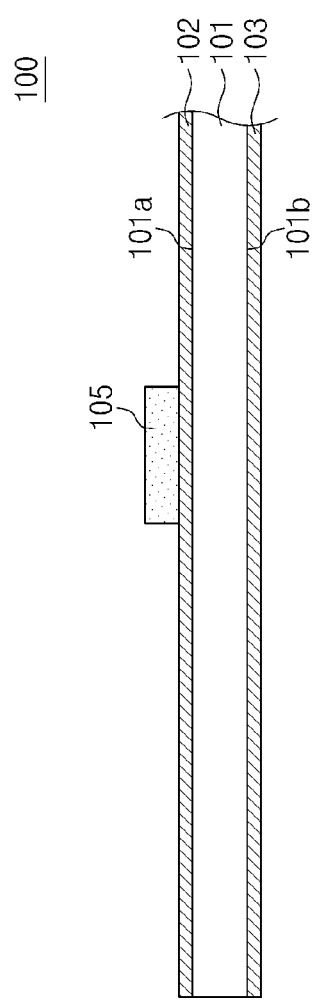
FIGS. 1 and 2 are cross-sectional views illustrating a chip-on-film package according to an example embodiment.

The inventive concepts will now be described more fully hereinafter with reference to the accompanying drawings, in which example embodiments are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, example embodiments are provided only to disclose the inventive concepts and let those skilled in the art know the category of the inventive concepts. In the drawings, example embodiments are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal example views of the inventive concepts. Accordingly, shapes of the example views may be modified according to manufacturing techniques and/or allowable errors. Therefore, the example embodiments are not limited to the specific shape illustrated in the example views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. Example embodiments explained and illustrated herein include their complementary counterparts. The same reference numerals or the same reference designators denote the same elements throughout the specification.

Moreover, example embodiments are described herein with reference to cross-sectional illustrations and/or plane illustrations those are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
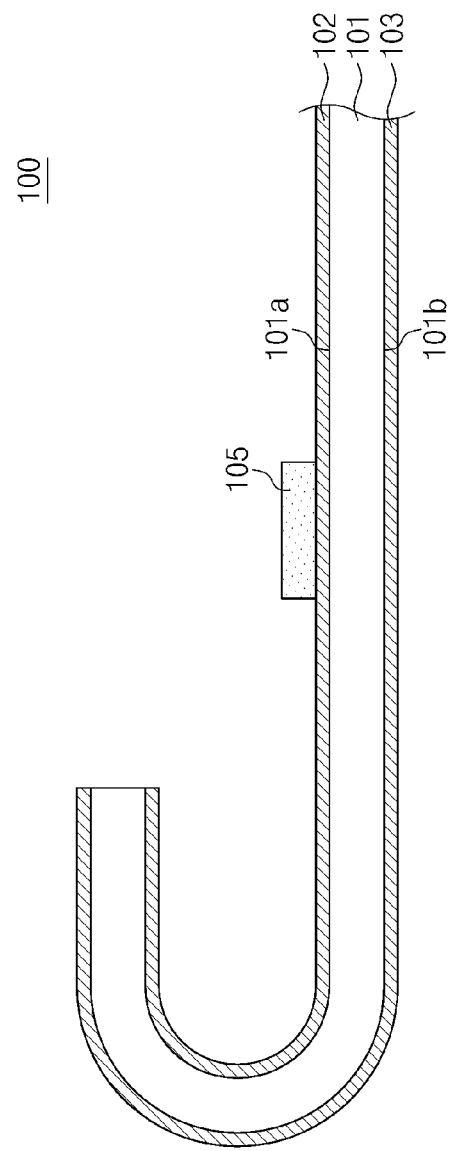

FIGS. 1 and 2 are cross-sectional views illustrating a chip-on-film package according to an example embodiment.

Referring to FIG. 1, a chip-on-film package 100 according to the present embodiment includes a film substrate 101. The film substrate 101 may be formed of a resin-based material (e.g., polyimide or polyester). Thus, the film substrate 101 may have flexibility. The film substrate 101 includes a first surface 101a and a second substrate 101b opposite to each other. The chip-on-film package 100 may include a first wire 102 disposed on the first surface 101a and a second wire 103 disposed on the second surface 101b. The first and second wires 102 and 103 may include a metal material having conductivity. For example, the first and second wires 102 and 103 may include copper (Cu). Even through not shown in detail in the drawings, input/output terminals may be formed at the first and second wires 102 and 103, and the rest portions of the first and second wires 102 and 103 except the input/output terminals may be covered and protected by insulating layers.

A semiconductor chip 105 is disposed on the first wire 102. The semiconductor chip 105 included in the chip-on-film package 100 may correspond to a gate driving integrated circuit for driving gate lines and/or a data driving integrated circuit for driving data lines. For example, the semiconductor chip 105 may be flip-chip bonded to the film substrate 101 by a tab automated bonding (TAB) method.

In the present example embodiment, the second wire 103 may fully cover the second surface 101b. However, the inventive concept is not limited thereto. In other embodiments, the second wire 103 may partially cover the second surface 101b. In other words, the second wire 103 may be locally disposed on the second surface 101b.

Referring to FIG. 2, the chip-on-film package 100 may be bent into a desired form due to the flexibility of the film substrate 101. Because the first and second wires 102 and 103 respectively disposed on the first and second surfaces 101a and 101b are formed of the metal material, the first and second wires 102 and 103 may also be bent into the desired form together with the film substrate 101. Thus, the chip-on-film package 100 can be bent into the desired form so as to be efficiently electrically connected to a circuit substrate and/or a display panel in a device assembly as described below.

The chip-on-film package 100 according to the present embodiment includes the first and second wires 102 and 103 respectively disposed on the first and second surfaces 101a and 101b of the film substrate 101. In other words, the first wire 102 is disposed on the first surface 101a on which the semiconductor chip 105 is disposed, and the second wire 103 is disposed on the second surface 101b on which the semiconductor chip 105 is not disposed. Accordingly, a physical plastic deformation of the second wire 103 disposed on the second surface 101b can offset an elastic restitution force of the film substrate 101 in the state that the chip-on-film package 100 is bent. Thus, the bent chip-on-film package 100 may be efficiently maintained.

The first and second wires 102 and 103 have heat conductivity higher than that of the film substrate 101, so that heat occurring from the semiconductor chip 105 may be efficiently exhausted. Additionally, due to the second wire 103 formed on the second surface 101b opposite to the first surface 101a on which the semiconductor chip 105 is disposed, the semiconductor chip 105 may be doubly protected in subsequent processes. Thus, electromagnetic interference (EMI) of the semiconductor chip 105 may also be improved.

In general, a chip-on-film package may have a single wire-structure having a metal wire disposed on only one surface of a film substrate and a semiconductor chip disposed on the one surface of the film substrate. On the contrary, the chip-on-film package 100 according to the present embodiment has a double wire-structure having metal wires 102 and 103 disposed on the first and second surfaces 101a and 101b of the film substrate 101, respectively. Thus, the semiconductor chip 105 and a circuit substrate described below may be more freely positioned. This will be described in more detail hereinafter.

Figure 3:
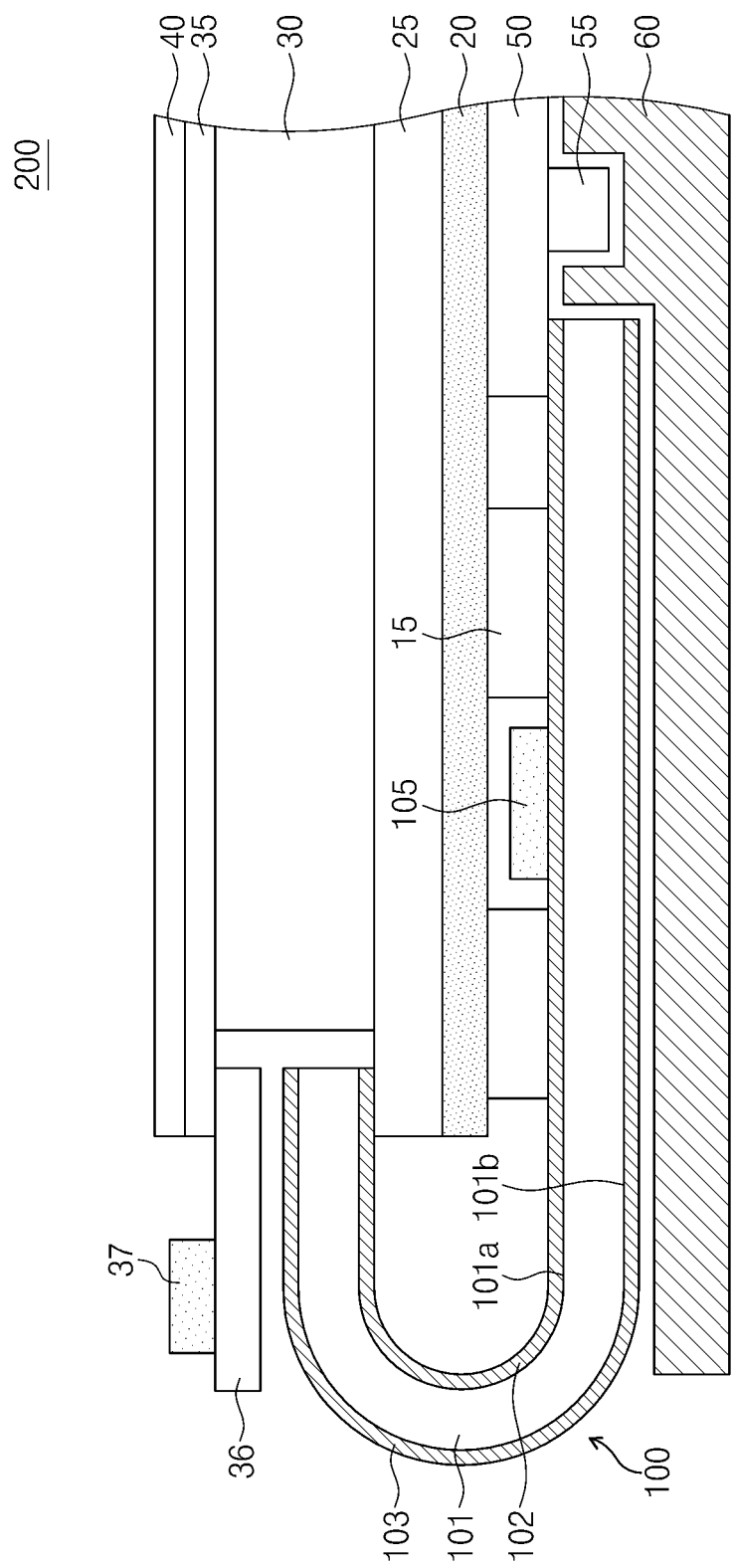
FIGS. 3 and 4 are cross-sectional views illustrating a portion of a device assembly according to some example embodiments.
Figure 4:
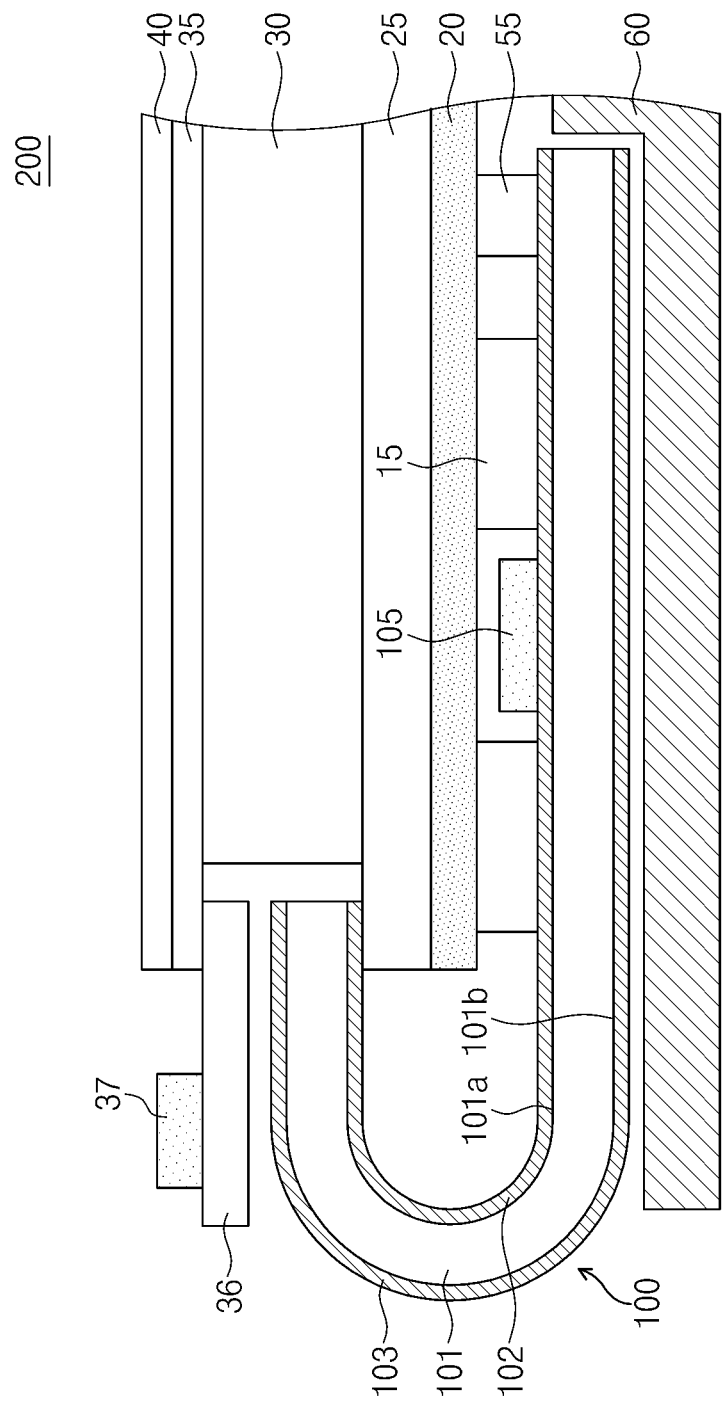

FIGS. 3 and 4 are cross-sectional views illustrating a portion of a device assembly according to some example embodiments.

Referring to FIG. 3, a device assembly 200 according to the present embodiment may include a chip-on-film package 100, a panel substrate 25, and a circuit substrate 50 which are disposed on a lower frame 60. The device assembly 200 may be a display device assembly. The chip-on-film package 100 may be the chip-on-film package 100 described above with reference to FIGS. 1 and 2.

The lower frame 60 surrounds outer walls of the chip-on-film package 100 and the circuit substrate 50, and is attached to a display panel 30. The panel substrate 25 may be formed of a glass. Alternatively, the panel substrate 25 may include a resin-based material (e.g., polyimide or polyester) having flexibility. If the panel substrate 25 is formed of the material having the flexibility, the device assembly 200 may be realized as a flexible display.

The circuit substrate 50 may be a conventional printed circuit board (PCB) or a flexible printed circuit board (FPCB). The circuit substrate 50 may receive various signals from an external system and then output various control signals driving the semiconductor chip 105 in the chip-on-film package 100. The semiconductor chip 105 may output a driving signal driving the display panel 30 in response to the various control signals. The display panel 30 may display an image in response to the driving signal inputted from the semiconductor chip 105. An electric component 55, which performs an electric function according to each of the signals, may be connected to the circuit substrate 50. The circuit substrate 50 and the electric component 55 may function as a controlling part of the device assembly 200.

The display panel 30 displaying the image may be disposed on the panel substrate 25. The display panel 30 may be an organic light emitting panel or a liquid crystal panel. However, the inventive concepts are not limited thereto. For example, the display panel 30 may include an organic light emitting device (OLED). The OLED may include a light emitting material capable of providing electro luminescence (EL). The OLED may be a passive matrix type or active matrix type OLED.

In some example embodiments, if the display panel 30 is the liquid crystal panel, even though not shown in the drawings, the display panel 30 may include a thin film transistor substrate and a color filter substrate opposite to each other and a liquid crystal injected therebetween. A light transmission rate of the liquid crystal may be controlled using thin film transistors, which are arranged in matrix form and operate as switching elements and, such that the display panel 30 may display the image. In this case, a back light assembly supplying light to the display panel 30 may further be disposed in the device assembly 200.

The device assembly 200 may further include a touch panel 35 and a passivation layer 40 disposed on the display panel 30. Even though not shown in the drawings, the touch panel 35 may include one or more touch sensing elements, and the touch sensing elements may include a plurality of touch driving electrodes and a conductive matrix. A touch panel driver may be disposed at one end of the touch panel 35. The touch panel driver may include a touch panel semiconductor chip 37 controlling the touch panel 35 and a touch panel connection part 36 connecting the touch panel semiconductor chip 37 to the touch panel 35. In some example embodiments, the touch panel 35 and the passivation layer 40 may be omitted.

A protecting film 20 may be disposed between the circuit substrate 50 and the panel substrate 25. An adhesive protecting layer 15 protecting the semiconductor chip 105 may be disposed between the protecting film 20 and the chip-on-film package 100. In some example embodiments, the adhesive protecting layer 15 and the protecting film 20 may be omitted.

The panel substrate 25 and the circuit substrate 50 may be electrically connected to both ends of the chip-on-film package 100, respectively. For example, the panel substrate 25 may be electrically connected to one end of the first wire 102 of the chip-on-film package 100, and the circuit substrate 50 may be electrically connected to the another end of the first wire 102. Thus, the first wire 102 of the chip-on-film package 100 may electrically connect the circuit substrate 50, the semiconductor chip 105, and the panel substrate 25 to each other. The circuit substrate 50, the chip-on-film package 100, and the panel substrate 25 may function as a driving part of the display device.

The semiconductor chip 105 included in the chip-on-film package 100 may correspond to the gate driving integrated circuit for driving gate lines and/or the data driving integrated circuit for driving data lines. The chip-on-film package 100 may be connected between the circuit substrate 50 and the display panel 30 through a tape carrier package (TCP) bonding process. The semiconductor chip 105 may receive a signal supplied from the circuit substrate 50 through the first wire 102 and generate a gate driving signal and/or a data driving signal. The semiconductor chip 105 may apply the gate driving signal and/or the data driving signal to the gate lines and/or the data lines.

The bent chip-on-film package 100 may electrically connect the panel substrate 25 and the circuit substrate 50 to each other in the device assembly 200. At this time, due to the elastic restitution force of the film substrate 101, the chip-on-film package 100 may not maintain the bent state thereof. Accordingly, a structure of the chip-on-film package 100 may be varied, or a joint portion between the panel substrate 25 and the circuit substrate 50 may break away. However, the chip-on-film package 100 according to the present embodiment has the double wire structure including the first and second wires 102 and 103. Thus, the physical plastic deformation of the first and second wires 102 and 103 including the metal can offset the elastic restitution force of the film substrate 101, so that the bent state of the chip-on-film package 100 may be efficiently maintained.

When the device assembly 200 is driven, a temperature of the semiconductor chip 105 may rise. The first and second wires 102 and 103 including the metal material may have heat conductivity greater than that of the film substrate 101. The chip-on-film package 100 according to the present embodiment includes the second wire 103 disposed on the second surface 101b opposite to the first surface 101a on which the semiconductor chip 105 is formed, so that the heat generated from the semiconductor chip 105 may be efficiently exhausted to the lower frame 60. Additionally, the semiconductor chip 105 may be protected by the second wire 103 disposed on the second surface 101b opposite to the first surface 101a on which the semiconductor chip 105 is formed. Accordingly, EMI characteristics may be improved.

Referring to FIG. 4, the circuit substrate 50 of FIG. 3 may be omitted in the device assembly 200. In this case, a printed circuit may be formed on the first wire 102, and the electric component 55 may be disposed on a region where the printed circuit is formed. Because the circuit substrate is omitted, a volume or thickness of the device assembly 200 may be reduced, thereby increasing integration degree of the device assembly 200.

A chip-on-film package according to other example embodiments and a device assembly including the same will be described hereinafter. The same elements as described in the embodiments of FIGS. 1 to 4 will be indicated by the same reference numerals or the same reference designators. For the purpose of ease and convenience of explanation, descriptions to the same elements as in the example embodiments of FIGS. 1 to 4 will be omitted or mentioned briefly. That is, features of the following example embodiments will be mainly described.

Figure 5:
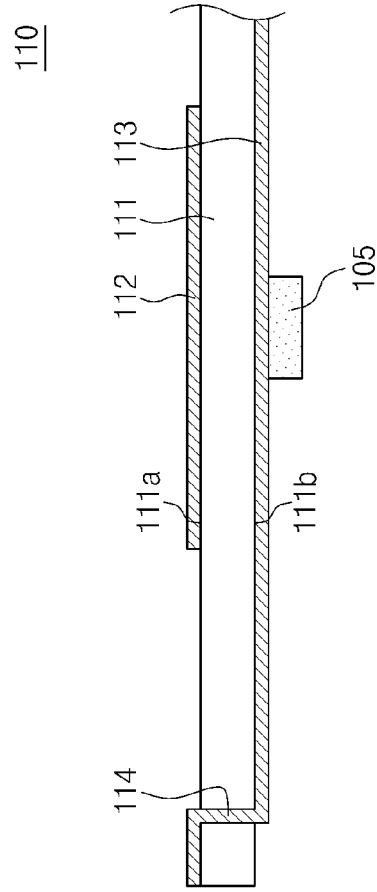
FIGS. 5 and 6 are cross-sectional views illustrating a chip-on-film package according to another example embodiment.
Figure 6:
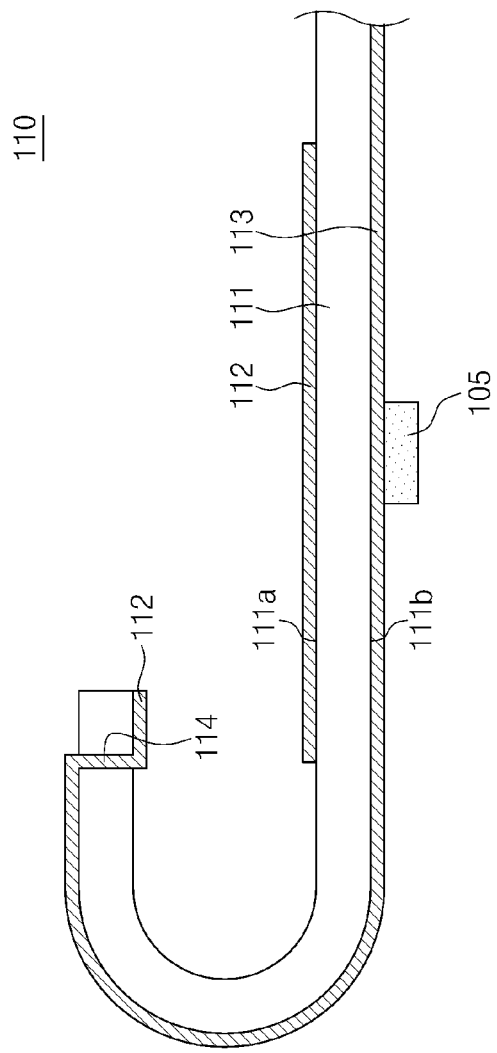

FIGS. 5 and 6 are cross-sectional views illustrating a chip-on-film package according to another example embodiment.

Referring to FIG. 5, a chip-on-film package 110 according to the present embodiment includes a film substrate 111, a first wire 112 disposed on a first surface 111a, and a second wire 113 disposed on a second surface 111b opposite to the first surface 111a. Materials of the film substrate 111 and the first and second wires 112 and 113 may be the same as those of the film substrate 101 and the first and second wires 102 and 103 described above with reference to FIGS. 1 and 2, respectively.

The chip-on-film package 110 includes a through-wire 114 penetrating the film substrate 111. A though-hole penetrating the film substrate 111 may be formed and then a conductive material may fill the through-hole to form the through-wire 114. The through-wire 114 may include a metal material having conductivity. For example, the through-wire 114 may include copper (Cu). In another example embodiments, the through-wire 114 may be formed of the same material as the first and second wires 112 and 113.

Both ends of the through-wire 114 are in contact with the first and second wires 112 and 113, respectively. Thus, the through-wire 114 electrically connects the first and second wires 112 and 113 to each other. One through-wire 114 is illustrated in FIG. 5. However, the inventive concepts are not limited thereto. In another example embodiments, a plurality of the through-wires 114 may be disposed in the chip-on-film package 110. The first and second wires 112 and 113 may fully cover the first and second surfaces 111a and 111b of the film substrate 111, respectively. Alternatively, as illustrated in FIG. 5, the first and second wires 112 and 113 may partially cover the first and second surfaces 111a and 111b, respectively. According to the present embodiment, the chip-on-film package 110 may include a semiconductor chip 105 disposed on the second wire 113.

Referring to FIG. 6, the chip-on-film package 110 may be bent into a desired form due to the flexibility of the film substrate 111. At this time, because the first and second wires 112 and 113 respectively disposed on the first and second surfaces 111a and 111b and are formed of the metal material, the first and second wires 112 and 113 may also be bent into the desired form together with the film substrate 111.

The chip-on-film package 110 according to the present embodiment may have a double layer structure including the first and second wires 112 and 113 disposed on the first and second surfaces 111a and 111b of the film substrate 111, so that the semiconductor chip 105 may be more freely positioned. In another example embodiments, the chip-on-film package 110 may include the semiconductor chip 105 disposed on the second wire 113 on the second surface 111b of the film substrate 111. In other words, the semiconductor chip 105 may be electrically connected to the second wire 113, and the second wire 113 may be electrically connected to the through-wire 114, and the through-wire 114 may be electrically connected to the first wire 112. Thus, even though the semiconductor chip 105 is disposed on the second surface 111b (i.e., a bottom surface) of the film substrate 111, it may be electrically connected to a panel substrate as described below. This will be described in more detail with reference to a device assembly hereinafter.

Figure 7:
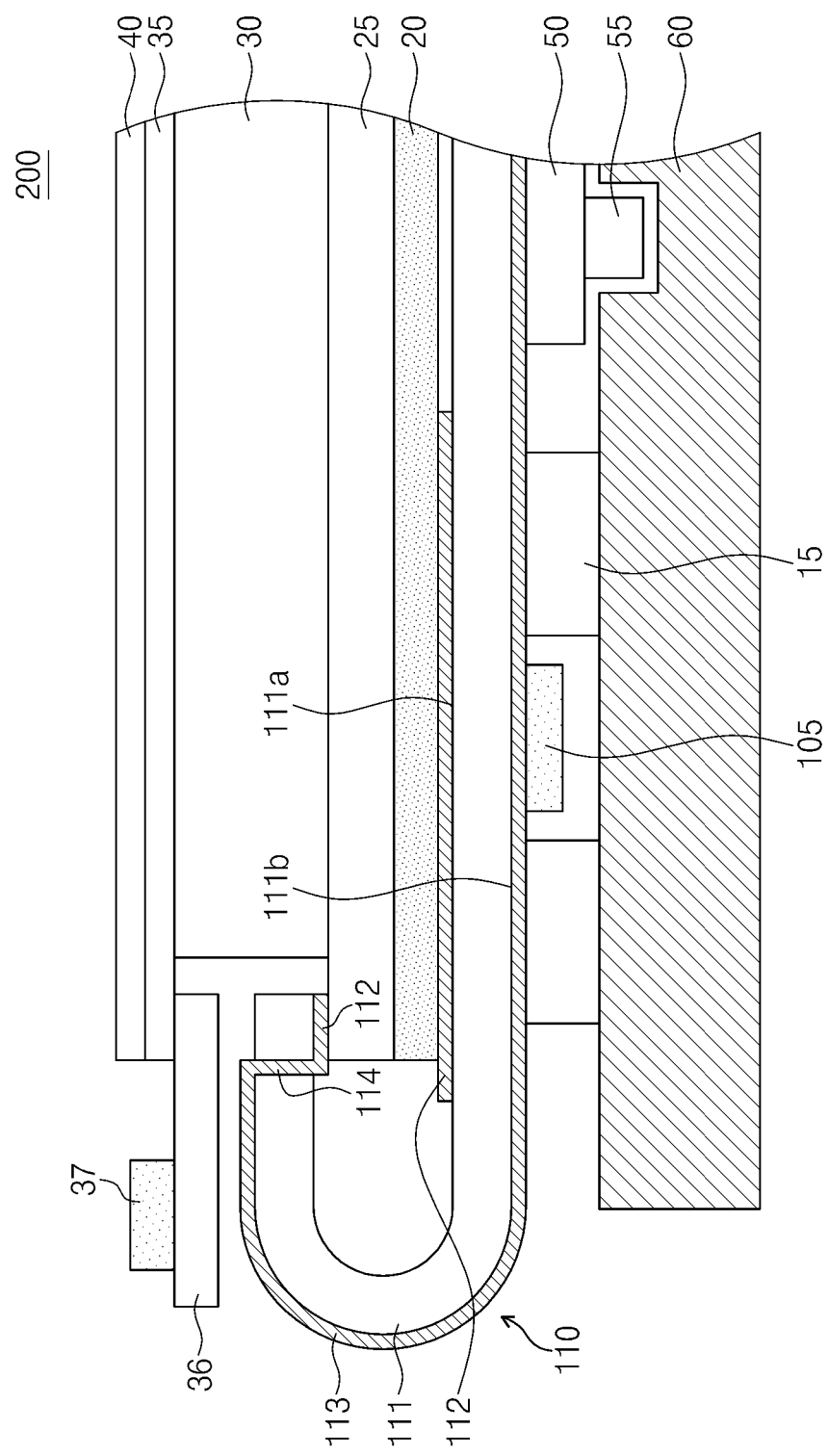
FIGS. 7 and 8 are cross-sectional views illustrating a portion of a device assembly according to other example embodiments.
Figure 8:
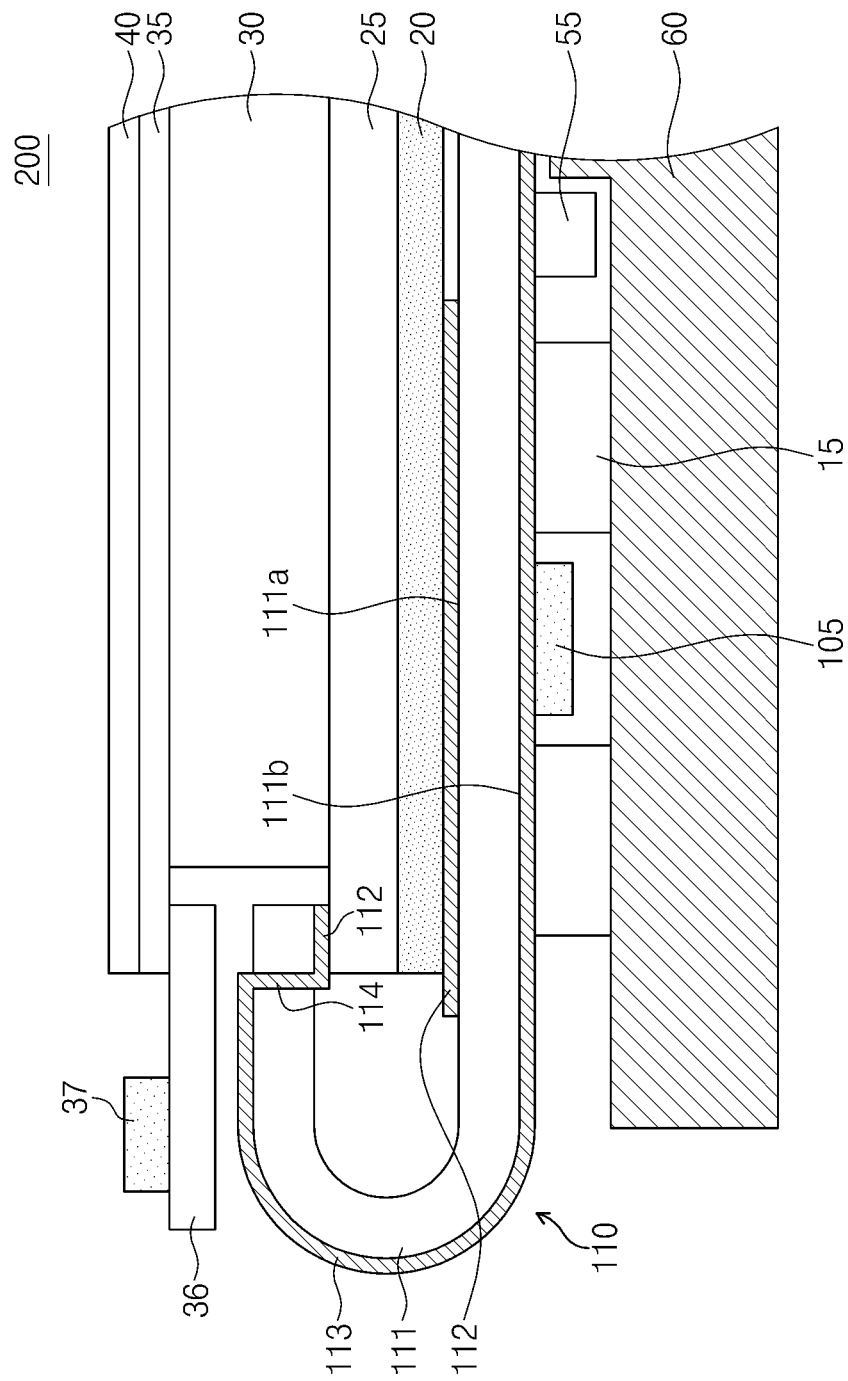

FIGS. 7 and 8 are cross-sectional views illustrating a portion of a device assembly according to other example embodiments. In the present embodiment, a semiconductor chip and a circuit substrate are disposed on a bottom surface of the chip-on-film package.

Referring to FIG. 7, a device assembly 200 according to the present embodiment may include a chip-on-film package 110, a panel substrate 25, and a circuit substrate 50 which are disposed on a lower frame 60. The device assembly 200 may be a display device assembly. The chip-on-film package 110 may be the chip-on-film package 110 described above with reference to FIGS. 5 and 6.

The panel substrate 25 and the circuit substrate 50 are electrically connected to both ends of the chip-on-film package 110, respectively. In the present embodiment, the panel substrate 25 is electrically connected to one end of the first wire 112 of the chip-on-film package 110, and the circuit substrate 50 is electrically connected to one end of the second wire 113 of the chip-on-film package 110. In other words, the circuit substrate 50 is electrically connected to the semiconductor chip 105 through the second wire 113, and the panel substrate 25 is electrically connected to the semiconductor chip 105 through the first wire 112. Because the first and second wires 112 and 113 are electrically connected to each other through the through-wire 114, the circuit substrate 50, the semiconductor chip 105, and the panel substrate 25 may be electrically connected to each other.

In the device assembly 200 according to the present embodiment, the chip-on-film package 110 includes the first and second wires 112 and 113 and the through-wire 114 electrically connecting the first and second wires 112 and 113 to each other, so that the semiconductor chip 105 and the circuit substrate 50 can be disposed on the second surface 111b (i.e., the bottom surface) of the chip-on-film package 110. Accordingly, it is possible to reduce or prevent deterioration of the device assembly 200 caused by heat generated from the semiconductor chip 105, and thereby increasing integration degree of the device assembly 200.

An adhesive protecting layer 15 protecting the semiconductor chip 105 may be disposed between the chip-on-film package 110 and the lower frame 60. A passivation film 20 may be disposed on the chip-on-film package 110 and the panel substrate 25. The adhesive protecting layer 15 and the passivation film 20 may be omitted in other embodiments.

Referring to FIG. 8, the circuit substrate 50 of FIG. 7 may be omitted in the device assembly 200. In this case, a printed circuit may be formed on the second wire 113 and the electric component 55 may be disposed on a region where the printed circuit is formed. Because the circuit substrate 50 is omitted, a volume and/or thickness of the device assembly 200 can be reduced. Accordingly, integration degree of the device assembly 200 can be increased.

Figure 9:
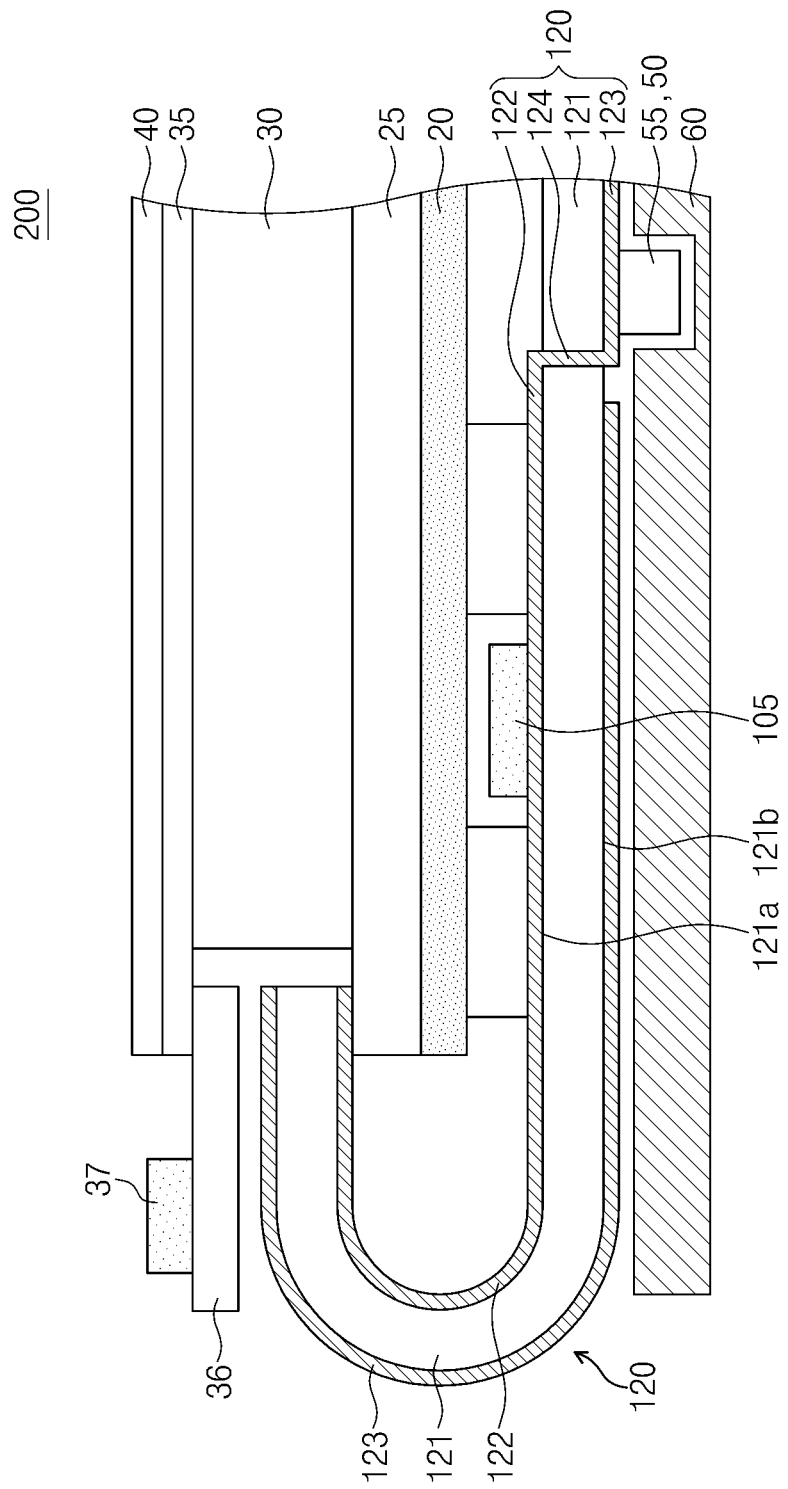
FIG. 9 is a cross-sectional view illustrating a portion of a device assembly according to still other example embodiments.

FIG. 9 is a cross-sectional view illustrating a portion of a device assembly according to still other example embodiments. In the present embodiment, a semiconductor chip is disposed on a top surface of a chip-on-film package and a circuit substrate is disposed on a bottom surface of the chip-on-film package.

Referring to FIG. 9, a device assembly 200 according to the present embodiment may include a chip-on-film package 120, a panel substrate 25, and a circuit substrate 50 which are disposed on a lower frame 60. The chip-on-film package 120 may include a first wire 122 disposed on a first surface 121a of a film substrate 121 and a second wire 123 disposed on a second surface 121b opposite to the first surface 121a of the film substrate 121. A through-wire 124 may penetrate the film substrate 121 so as to electrically connect the first and second wires 122 and 123 to each other.

A semiconductor chip 105 may be disposed on the first wire 122. The panel 25 and the semiconductor chip 105 may be electrically connected to the first wire 122, and the circuit substrate 50 may be electrically connected to the second wire 123. The through-wire 124 may be disposed between the semiconductor chip 105 and the circuit substrate 50. Because the first and second wires 122 and 123 are electrically connected to each other through the through-wire 124, the circuit substrate 50, the semiconductor chip 105, and the panel substrate 25 may be electrically connected to each other.

In other words, because the through-wire 124 is formed between the semiconductor chip 105 and the circuit substrate 50 in the present embodiment, the semiconductor chip 105 can be disposed on the first surface 121a corresponding to the top surface of the chip-on-film package 120, and the circuit substrate 50 can be disposed on the second surface 121b corresponding to the bottom surface of the chip-on-film package 120. In still other example embodiments, the circuit substrate 50 may be omitted. In this case, a printed circuit may be formed on the second wire 123, and the electric component 55 may be formed on the printed circuit on the second wire 123.

Figure 10:
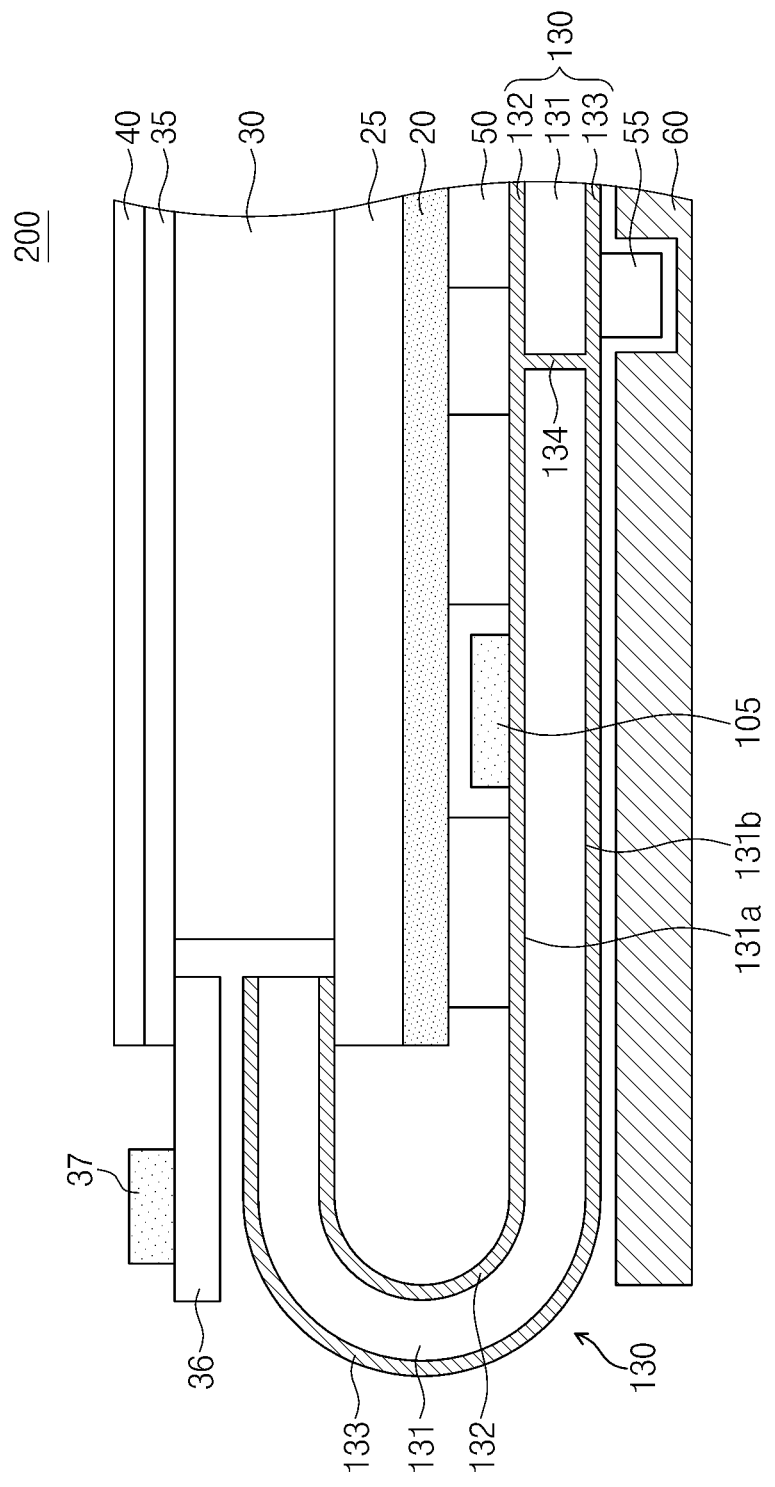
FIG. 10 is a cross-sectional view illustrating a portion of a device assembly according to yet other example embodiments.

FIG. 10 is a cross-sectional view illustrating a portion of a device assembly according to yet other example embodiments. In the present embodiment, a semiconductor chip and a circuit substrate may be disposed on a top surface of a chip-on-film package, and the electric component may be disposed on a bottom surface of the chip-on-film package.

Referring to FIG. 10, a device assembly 200 according to the present embodiment may include a chip-on-film package 130, a panel substrate 25, and a circuit substrate 50 which are disposed on a lower frame 60. The chip-on-film package 130 includes a first wire 132 disposed on a first surface 131a of a film substrate 131 and a second wire 133 disposed on a second surface 131b opposite to the first surface 131a of the film substrate 131. The first and second wires 132 and 133 may fully cover the first and second surfaces 131a and 131b of the film substrate 131, respectively. A through-wire 134 may penetrate the film substrate 131 so as to electrically connect the first and second wires 132 and 133 to each other. The through-wire 134 may be disposed between the semiconductor chip 105 and the electric component 55.

The semiconductor chip 105 and the circuit substrate 50 may be disposed on the first wire 132. The panel substrate 25, the semiconductor chip 105, and the circuit substrate 50 may be electrically connected to each other through the first wire 132. The electric component 55 may be electrically connected to the second wire 133. The first and second wires 132 and 133 may be electrically connected to each other through the through-wire 134 so that the electric component 55 and the circuit substrate 50 may be electrically connected to each other.

In the example embodiments described above with reference to FIGS. 1 to 10, the chip-on-film package includes the first and second wires respectively disposed on the top surface and the bottom surface of the film substrate. Accordingly, in the state that the chip-on-film package is bent, the first and second wires formed of the metal material can offset the elastic restitution force of the film substrate so that the bent state of the chip-on-film package may be efficiently maintained. Additionally, because the first and second wires have heat conductivity higher than that of the film substrate, the heat generated from the semiconductor chip may be efficiently exhausted. Thus, the semiconductor chip may be doubly protected in subsequent processes. Thus, EMI characteristics may also be improved.

Furthermore, the chip-on-film package according to the inventive concepts may have the double layer structure of the first and second wires and include the through-wire electrically connecting the first and second wires to each other. Thus, the semiconductor chip, the circuit substrate, and the electrical component may be more freely positioned in the device assembly including the chip-on-film package according to the inventive concepts. Accordingly, the volume and/or thickness of the device assembly may be reduced, thereby increasing the integration degree of the device assembly.

The chip-on-film package according to the inventive concepts may be applied to a display device using an organic light emitting device and a liquid crystal panel display device. Additionally, the chip-on-film package may also be applied to a plasma display panel device. Furthermore, the chip-on-film package may be applied to all electronic devices using display devices, e.g., cellular phones, personal digital assistants (PDA), and laptop computers.

The chip-on-film package according to the inventive concepts includes the first and second wires respectively disposed on the top surface and the bottom surface of the film substrate. Accordingly, in the state that the chip-on-film package is bent, the first and second wires formed of the metal material can offset the elastic restitution force of the film substrate. Thus, the bent state of the chip-on-film package may be efficiently maintained. Additionally, because the first and second wires have heat conductivity higher than that of the film substrate, the heat generated from the semiconductor chip may be efficiently exhausted. Accordingly, the semiconductor chip may be doubly protected in subsequent processes. Thus, EMI characteristics may also be improved.

Furthermore, the device assembly according to the inventive concepts may have the double layer structure of the first and second wires and include the through-wire electrically connecting the first and second wires to each other. Thus, the semiconductor chip, the circuit substrate, and the electrical component may be more freely positioned in the device assembly. Accordingly, the volume and/or thickness of the device assembly may be reduced, thereby increasing the integration degree of the device assembly.

While the inventive concepts have been described with reference to example embodiments, it will be apparent to those skilled in the art that various changes and modifications may be made without departing from the spirit and scope of the inventive concepts. Therefore, it should be understood that the above example embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A device assembly comprising:
   a film package including,
      a semiconductor chip,
      a film substrate having a U-shape at at least one end thereof,
      a first wire on a top surface of the film substrate, the first wire including a first portion and a second portion spaced apart from the first portion to expose a portion of the film substrate therebetween, and
      a second wire on a bottom surface of the film substrate;
   a panel substrate connected to one end of the film package; and
   a display panel on the panel substrate,
   wherein the first portion of the first wire is adjacent to a bottom surface of the panel substrate and the second portion of the first wire is adjacent to a top surface of the panel substrate.

2. The device assembly of claim 1, wherein the panel substrate is electrically connected to the first wire.

3. The device assembly of claim 1, wherein the film package includes at least one through-wire connecting the first wire to the second wire.

4. The device assembly of claim 1, further comprising:
   a controlling part connected to another end of the film package, wherein the semiconductor chip and the controlling part are on the first wire and are electrically connected to each other through the first wire.

5. The device assembly of claim 3, wherein the semiconductor chip and a controlling part connected to another end of the film package are on the second wire and are electrically connected to each other through the second wire.

6. The device assembly of claim 3, wherein the semiconductor chip is on the first wire and is electrically connected to the first wire; and
   wherein a controlling part connected to another end of the film package is on the second wire and is electrically connected to the second wire.

7. The device assembly of claim 1, further comprising:
   a controlling part connected to another end of the film package, the controlling part including at least one of a circuit substrate and an electric component electrically connected to the circuit board,
   wherein the circuit substrate includes a printed circuit board (PCB) or a flexible printed circuit board (FPCB).

8. The device assembly of claim 7, wherein the circuit substrate is on one of the first and second wires and the electric component is on the other one of the first and second wires.

9. The device assembly of claim 1, wherein the controlling part includes an electric component disposed on and electrically connected to the first wire or the second wire.

10. The device assembly of claim 1, wherein at least one of the panel substrate and the film substrate has flexibility.

11. The device assembly of claim 1, wherein the display panel includes an organic light emitting device or a liquid crystal panel.

12. The device assembly of claim 1, further comprising:
   a touch panel on the display panel; and
   a touch panel driver connected to one end of the touch panel.

* * * * *